US006991985B2

(12) United States Patent
Dong et al.

(10) Patent No.: US 6,991,985 B2
(45) Date of Patent: Jan. 31, 2006

(54) METHOD OF MANUFACTURING A SEMICONDUCTOR DEVICE

(75) Inventors: Cha Deok Dong, Ichon (KR); Seung Woo Shin, Ichon (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 107 days.

(21) Appl. No.: 10/617,476

(22) Filed: Jul. 11, 2003

(65) Prior Publication Data

US 2004/0102005 A1 May 27, 2004

(30) Foreign Application Priority Data

Nov. 27, 2002 (KR) ............... 10-2002-0074456

(51) Int. Cl.
 *H01L 21/336* (2006.01)

(52) U.S. Cl. ...................... 438/261; 438/287
(58) Field of Classification Search ........... 438/261, 438/263, 264, 287, 591, 594, 954
See application file for complete search history.

(56) References Cited

U.S. PATENT DOCUMENTS 6,127,227 A * 10/2000 Lin et al. ............... 438/261
6,344,394 B1 * 2/2002 Kaneoka ................. 438/261
6,362,045 B1 * 3/2002 Lin et al. ................ 438/264
6,396,099 B2   5/2002 Joo et al.
6,512,264 B1 * 1/2003 Ogle et al. .............. 257/324
2003/0153149 A1 * 8/2003 Dong et al. ............. 438/257

FOREIGN PATENT DOCUMENTS

JP         2246162       10/1990
KR      1019990068095     7/2001

OTHER PUBLICATIONS

Office Action from the R.O.C. (Taiwan) Intellectual Property Office dated Mar. 18, 2005 (9 pages).

Office Action from the Korean Intellectual Property Office dated Jun. 7, 2005 (2 pages).

* cited by examiner

*Primary Examiner*—Chandra Chaudhari
(74) *Attorney, Agent, or Firm*—Marshall, Gerstein & Borun LLP

(57) ABSTRACT

Disclosed is a method of manufacturing a semiconductor device. A floating gate is formed and a nitrification process is then implemented. With the disclosed process, it is possible to improve the roughness of the top surface of the floating gate electrode. Furthermore, a nitrification process and a dielectric film formation process are implemented in-situ, which simplifies the manufacturing process.

16 Claims, 3 Drawing Sheets

METHOD OF MANUFACTURING A SEMICONDUCTOR DEVICE

BACKGROUND

1. Technical Field

A method of forming a dielectric film of a flash memory cell of semiconductor device is disclosed.

2. Background of the Related Art

Recently, as the design rule is reduced and the size of the device is reduced, it is difficult to control overlapping of a field oxide film (FOX) that has the greatest influence on the distance between the floating gates and coupling in the flash memory cell. In general, the flash memory cell is implemented using the STI process. Upon isolation of the floating gate, the uniformity of the wafer depending on variation of the critical dimension (CD) is not easy in the patterning process using the mask. For this reason, there is a problem that the coupling ratio between the devices is not uniform. Furthermore, if a high bias voltage is applied during the programming or erasing operation of the flash memory devices, defective flash memory devices may occur due to a uniform floating gate.

An electric field is concentrated on a given region since the surface roughness of the surface of the floating gate electrode is increased. It is difficult to obtain an effective thickness of the dielectric film between the floating gate and the control gate. Further, there is a problem that improvement on the storage characteristic of the flash memory cell is difficult due to an increase in the leakage current.

SUMMARY OF THE DISCLOSURE

Accordingly, to substantially obviate one or more problems, limitations and disadvantages of the related art, a method of manufacturing a semiconductor device that can improve the roughness of the surface of the floating gate electrode using $N_2O$ gas, prohibit concentration of an electric field on the surface of the gate electrode by improving characteristics of the dielectric film formed on the floating gate electrode, reduce generation of the leakage current of the dielectric film, and improve the storage characteristic of the flash memory cell by increasing charge-to-breakdown and a breakdown region.

Additional advantages, and features of the disclose method will be set forth in part in the description which follows and will become apparent to those having ordinary skill in the art. Method of manufacturing a semiconductor device is characterized in that it comprises providing a semiconductor substrate in which a floating gate electrode is formed, nitrifying the top of the floating gate electrode, forming a dielectric film along the step of the results, and forming a material film for a control gate electrode on the dielectric film, wherein the nitrifying the tope of the floating gate electrode and the forming the dielectric film are implemented in-situ within the same chamber.

In an embodiment, another disclosed method, the method comprises loading a semiconductor substrate in which a floating gate electrode is formed into a deposition chamber, changing the temperature within the deposition chamber to a first deposition temperature, nitrifying the top of the floating gate electrode at the first deposition temperature, changing the temperature within the deposition chamber to a second deposition temperature range, sequentially depositing a first oxide film, a nitride film and a second oxide film along the step in the second deposition temperature range to form a dielectric film, and unloading the semiconductor substrate from the deposition chamber.

It is to be understood that both the foregoing general description and the following detailed description are exemplary and explanatory and are intended to provide further explanation of the claimed methods.

BRIEF DESCRIPTION OF THE DRAWINGS

The above and other features and advantages of the disclosed methods will be apparent from the following detailed description of the preferred embodiments in conjunction with the accompanying drawings, wherein.

DETAILED DESCRIPTION OF THE PRESENTLY PREFERRED EMBODIMENTS

Figure 1A:
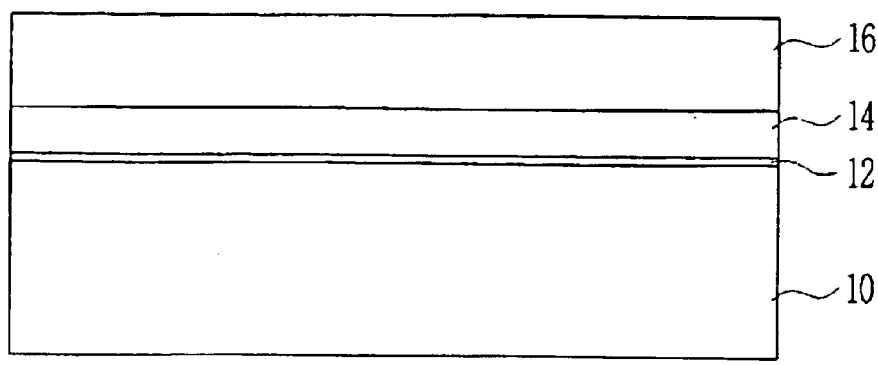
FIG. 1A~FIG. 1G are cross-sectional views of semiconductor devices for explaining a disclosed method.

Reference will now be made in detail to the preferred embodiments, examples of which are illustrated in the accompanying drawings, in which like reference numerals are used to identify the same or similar parts.

FIG. 1A~FIG. 1G are cross-sectional views of semiconductor devices for explaining disclosed methods of manufacturing semiconductor devices.

Referring to FIG. 1A, a screen oxide film (not shown) required for prohibition of crystal defects or surface treatment and serving as a buffer layer upon ion implantation is formed on a semiconductor substrate 10. An ion implantation process is then implemented to form a well. After the screen oxide film is removed, a tunnel oxide film 12, a first polysilicon film 14 and a pad nitride film 16 are sequentially deposited.

In the concrete, before the screen oxide film, a pretreatment cleaning process is implemented using DHF (dilute HF) where $H_2O$ and HF are mixed in the ratio of 50:1 and SC-1 (standard cleaning-1) made of $NH_4OH$, $H_2O_2$ and $H_2O$, or BOE (buffered oxide etchant) where $NH_4F$ and HF are mixed in the ratio of 100:1~300:1 and SC-1 made of $NH_4OH$, $H_2O_2$ and $H_2O$, in order to clean the semiconductor substrate 10. A dry or wet oxidization process is implemented in the temperature range of 750~800° C. to form the screen oxide film of 30~120 Å in thickness.

After the ion implantation process, the screen oxide film is etched using DHF where $H_2O$ and HF are mixed in the ration of 50:1 and SC-1 made of $NH_4OH$, $H_2O_2$ and $H_2O$. The tunnel oxide film 12 is formed in thickness of 85~110 Å at a temperature of 750~800° C. by means of a wet oxidization mode. After the tunnel oxide film 12 is deposited, an annealing process is implemented using $N_2$ at a temperature of 900~910° C. for 20~30 minutes to is minimize the defect density of the interface between the tunnel oxide film 12 and the semiconductor substrate 10.

A first polysilicon film 14 being an amorphous silicon film into which P concentration of 1.0E20~5.0E20 atoms/cc is doped is deposited in thickness of 300~500 Å on the tunnel oxide film 12 using $SiH_4$ or $Si_2H_6$ and $PH_3$ gas, by means of a chemical vapor deposition (CVD) method, a low pressure CVD method (LP-CVD) method, a plasma enhanced CVD (PE-CVD) method or an atmospheric pressure CVD (AP-CVD) method at a temperature of 480~550 under a pressure of 0.1~3.0 torr. As the grain size of the first polysilicon film 14 is minimized, concentration of the electric field could be prevented. A pad nitride film 16 having a relatively high thickness of about 900~2000 Å is then formed on the first polysilicon film 14 by means of the LP-CVD method.

Figure 1B:
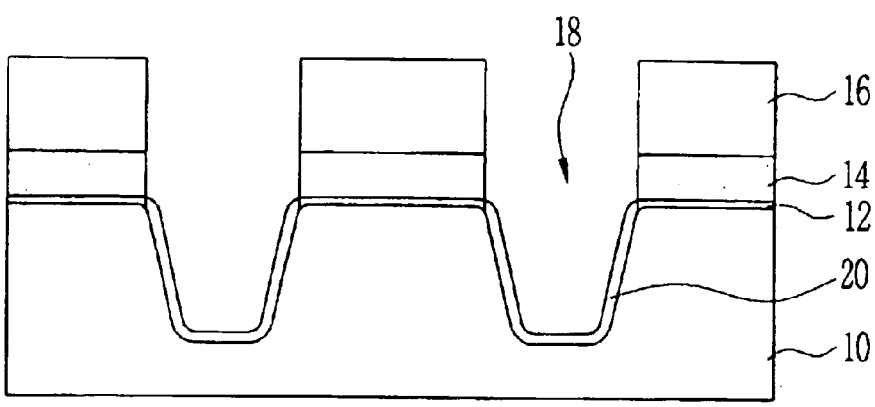

Referring to FIG. 1B, the pad nitride film 16, the first polysilicon film 14, the tunnel oxide film 12 and the semiconductor substrate 10 are sequentially etched through an ISO (isolation) mask patterning to form a trench 18 of a STI (shallow trench isolation) structure, thus defining an active region and a field region. A dry oxidization process for compensating for etch damage at the sidewall of the trench 18 of the STI structure is implemented to make rounded the corner of the trench 18. High temperature oxide (HTO) is thinly deposited on the entire structure and is then experienced by a densification process at high temperature, thus forming a liner oxide film (not shown). At this time, in order to simplify the process, the process of depositing the liner oxide film may be omitted.

In detail, after a photoresist film is covered on the entire structure, a photolithography process using the photoresist film as a mask is implemented to form a photoresist film pattern (not shown). An etch process using the photoresist film pattern as an etch mask is then implemented to etch the pad nitride film 16, the first polysilicon film 14, the tunnel oxide film 12 and the semiconductor substrate 10, thus forming the trench 18 of the STI structure. In forming the trench, the semiconductor substrate is etched to have a specific tilt angle of 65~85°. In order to compensate for damage of the sidewall of the trench 18 due to the etch process and make rounded the top corner of the trench, a dry oxidization process is implemented at a temperature of 750~900° C. to form an oxide film 20 of 50~150 Å in thickness. A low dry oxidization process is implemented to minimize diffusion of the ions implanted in order to control the well or the threshold voltage (Vt), so that a normal junction and well are kept.

In order to improve an adhesive characteristic between an oxide film in a subsequent process and the trench 18 and prevent generation of a moat, HTO formed using DCS (dichloro silane; $SiH_2CL_2$) gas is deposited in thickness of 50~150° C. A high temperature densification process is then implemented using $N_2$ at a temperature of 1000~1100° C. for 20~30 minutes, thus forming a liner oxide film (not shown). As the density of the tissue of liner oxide film is increased by the high temperature densification process, it helps to increase the etch resistance, prohibit formation of a moat when implementing STI and prevent leakage current.

Figure 1C:
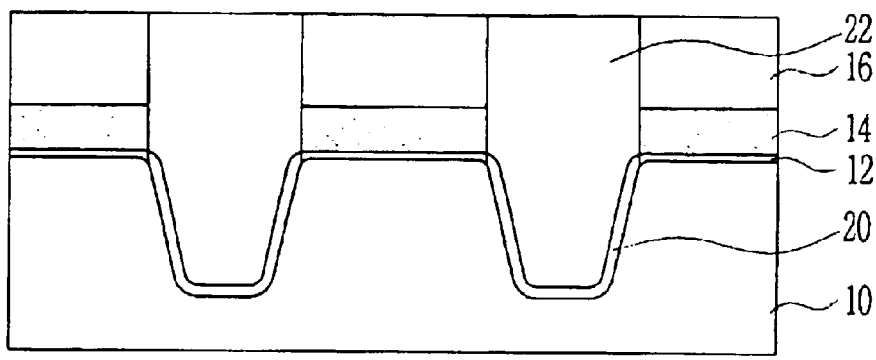

Referring to FIG. 1C, a high density plasma (HDP) oxide film 22 is deposited to bury the trench 18. A planarization process using the pad nitride film 16 as a stop layer is then implemented to remove the HDP oxide film 20 and the liner oxide film on the pad nitride film 16. An isolation film for isolating elements is thus formed.

In the concrete, the HDP oxide film 22 of 4000~10000 Å in thickness is formed in order to fall the trench 18. At this time, the HDP oxide film 22 is formed so that an empty space is not formed within the trench 18.

After a planarization process using CMP is implemented, a post cleaning process using BOE or HF is implemented in order to remove any oxide film that may remain on the pad nitride film 16. At this time, a reduction in the height of the HDP oxide film 22 due to over-etch can be prohibited. The HDP oxide film 22 buries the trench and the top of the HDP oxide film 22 protrudes above the polysilicon film 14. Thus, the HDP oxide film 22 serves as an isolation film for isolating the floating gate electrodes that are formed in a subsequent process.

Figure 1D:
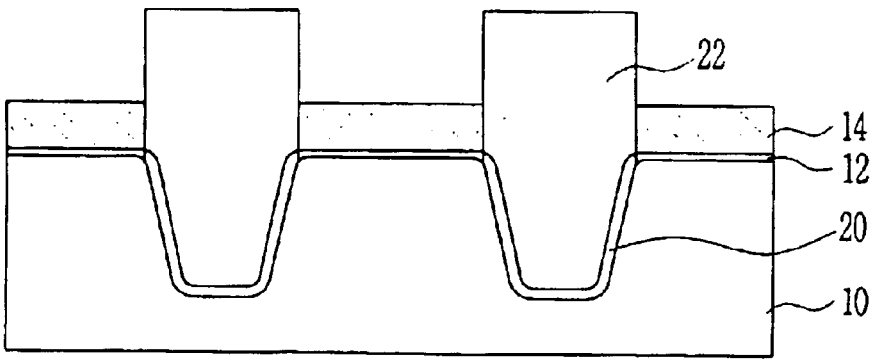
Figure 1E:
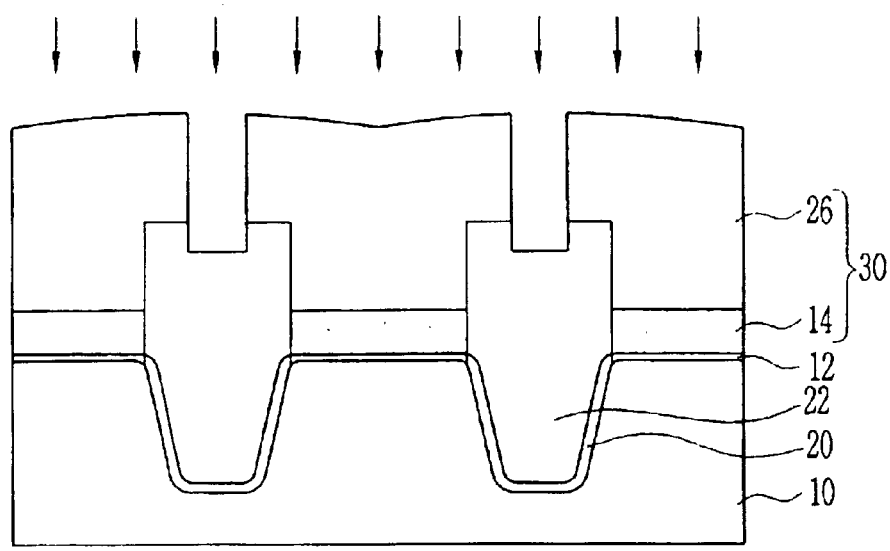

Referring to FIG. 1D and FIG. 1E, a nitride film strip process using phosphoric acid ($H_3PO_4$) is implemented to etch the pad nitride film 16. A pre-treatment cleaning process using DHF is then implemented to remove a native oxide film and remnants formed on the first polysilicon film 14. A second polysilicon film 26 is deposited on the entire structure. A patterning process is then implemented to form a floating gate electrode 30.

In detail, the strip process is implemented to expose the first polysilicon 14. The wet cleaning process is then implemented to minimize the interfacial effect between the first and second polysilicon films 14 and 26.

A second polysilicon film 26 being an amorphous silicon film into which P concentration of about 1.0E20~5.0E20 atoms/cc is doped is deposited in thickness of 1000~3000 Å, on the entire structure, using $SiH_4$ or $Si_2H_6$ and $PH_3$ gas by means of the CVD, LP-CVD, PE-CVD or AP-CVD method at a temperature of 480~550° C. under a pressure of 0.1~3.0 torr. However, the present invention is not limited to thereto. Instead, the second polysilicon film 26 may be formed in thickness enough to maximize the coupling ration of the flash memory device.

A photoresist film is covered on the second polysilicon film 26. A photolithography process using a mask for the floating gate is then implemented to form a photoresist pattern (not shown). Next, an etch process using the photoresist pattern as an etch mask is implemented to form a floating gate electrode 30. At this time, the top of the HDP oxide film 22 is formed to be recessed by over-etch for removing a part of the exposed HDP oxide film 22, so that the floating gate electrode 30 is definitely isolated and damage of the HDP oxide film 22 is minimized.

Figure 2:
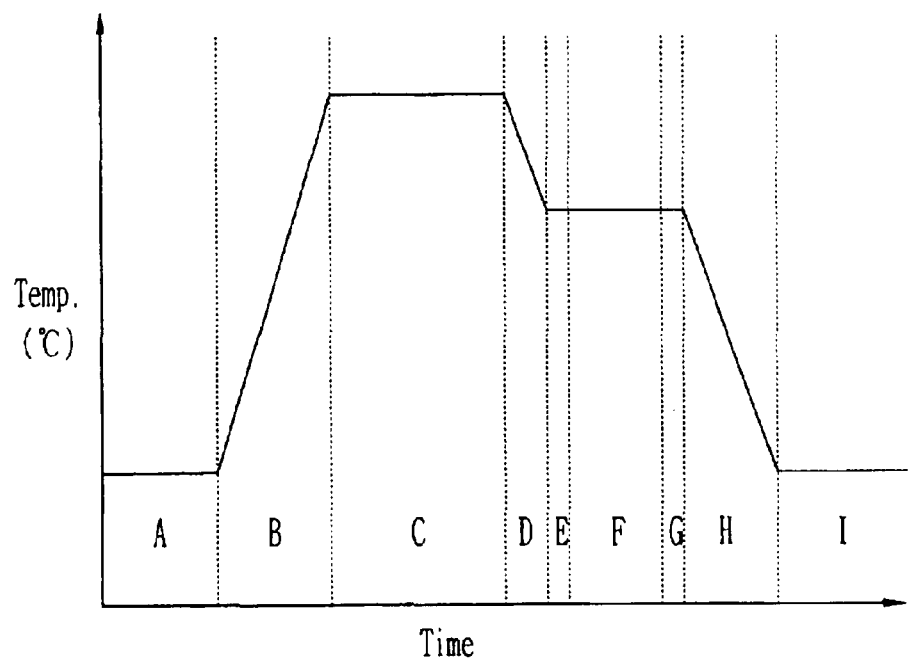
FIG. 2 is a conceptual drawing for explaining the surface treatment process and a process of depositing a dielectric film.

FIG. 2 is a conceptual drawing for explaining the surface treatment process and a process of depositing a dielectric film.

Figure 1F:
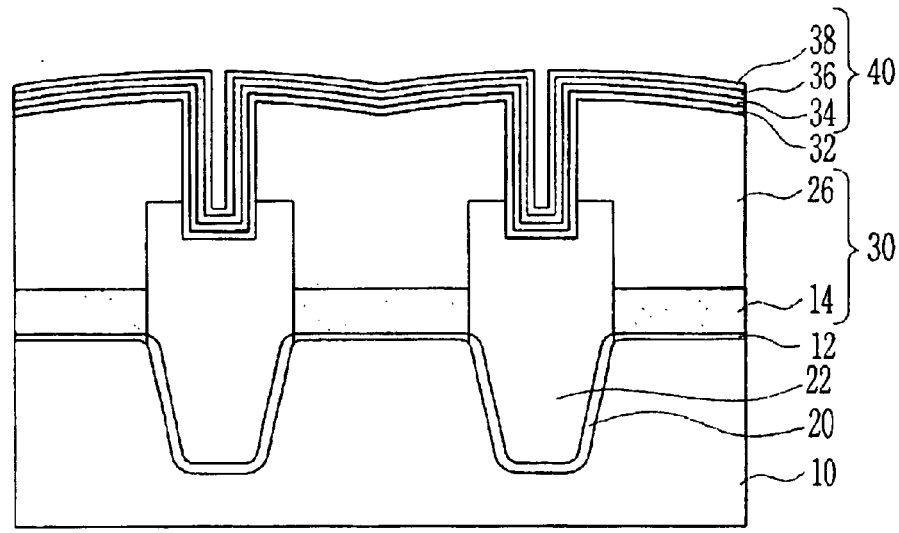

Referring to FIG. 1F and FIG. 2, a cleaning process is implemented to remove a native oxide film formed on the surface of the entire structure including the floating gate electrode 30. A surface treatment process is then implemented to nitrify the entire surface. Next, a dielectric film 40 is formed on the entire structure along its step. At this time, all the processes are implemented in-situ, so that the process could be simplified and the cost price could be reduced.

In the concrete, surface treatment for the floating gate electrode 30 is implemented to form a nitrification layer 32. A dielectric film 40 of an ONO (first oxide film 34-nitride film 36-second oxide film 38; $SiO_2$—$Si_3N_4$—$SiO_2$) structure is then formed. Next, the semiconductor substrate 10 in which the floating gate electrode 30 is formed is loaded onto a deposition chamber in which a temperature of 400~700° C. is kept under $N_2$ gas atmosphere (A region in FIG. 2). The temperature of the chamber is rapidly raised to over 800° C. for a given period of time (B region in FIG. 2). An annealing process is then implemented for 5~60 minutes by introducing $N_2O$ gas of 100~10000 sccm at a temperature of 850~950° C. under a pressure of 10~760 torr (C region FIG. 2). A thin nitrification layer 32 is thus formed on the entire structure.

After the annealing process using $N_2O$ gas, the temperature of the chamber is lowered to 750° C. (D region in FIG. 2). A DCS (dichloro silane; $SiH_2CL_2$) gas as a deposition gas is also introduced into the chamber under a low pressure of 0.1~3 torr at a temperature of 790~830° C. The two gases are controlled so that the ratio of DCS and $N_2O$ in the range 1:5~1:10, so that the first oxide film 34 is formed along the step of the entire structure (E region in FIG. 2). In the above, the first oxide film 34 is formed in thickness of 35~100 Å using hot temperature oxide.

The nitride film 36 using DCS gas and $NH_3$ gas as a source is formed on the first oxide film 34 by stopping introduction of $N_2O$ gas into the chamber and introducing $NH_3$ gas (F region in FIG. 2). In the above, the nitride film 36 is deposited in thickness of 50~100 Å by means of a chemical vapor deposition method under a low pressure of 0.1~3 torr at a temperature of 650~800° C.

Introduction of $NH_3$ gas into the chamber is stopped, and $N_2O$ gas and DCS gas are continuously introduced into the chamber, thus forming the second oxide film 38 on the nitride film 36 (G region in FIG. 2). The deposition condition of the second oxide film 38 is same to that of the first oxide film 34 except that the annealing process is not implemented. The second oxide film 38 is formed in thickness of 35~150 Å. The temperature of the chamber is lowered to 400~700° C. for a given period of time (H region in FIG. 2) and the semiconductor substrate is unloaded (I region in FIG. 2). At this time, it should be noted that the first oxide film, the nitride film and the second oxide film might be deposited at the same temperature.

After the dielectric film 40 of the ONO structure is formed, in order to improve the quality of the ONO and enhance the interface between respective layers, a steam anneal process may be implemented so that the dielectric film 40 is oxidized in thickness of about 150~300 Å centering around a monitoring wafer at a temperature of about 750~800° C. in a wet oxidization mode. Furthermore, when the ONO process and the steam anneal process are implemented, they are implemented with no time delay within several time delay between respective processes, so that contamination by the native oxide film or the impurity is prevented.

Figure 1G:
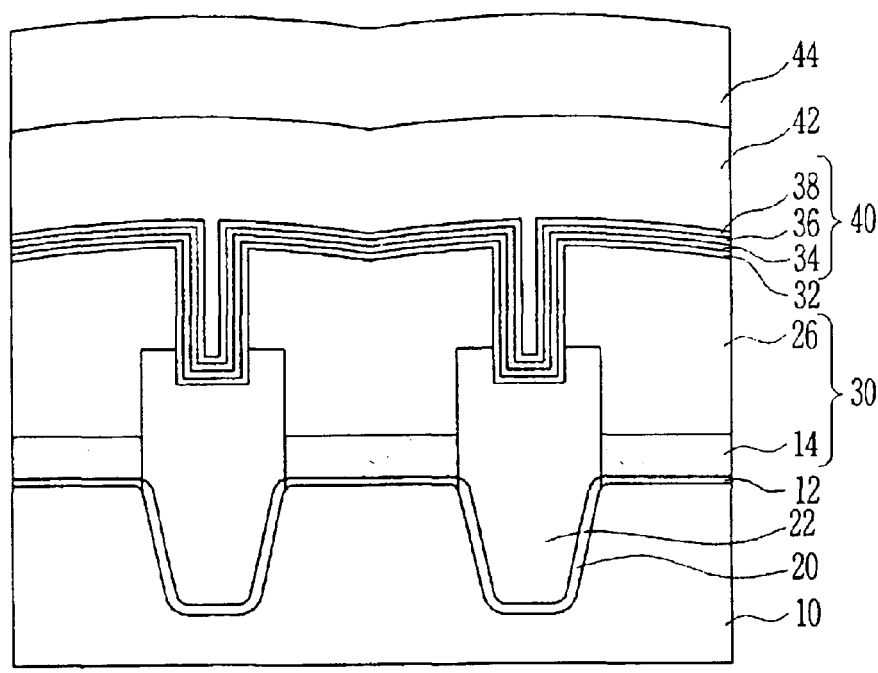

Referring to FIG. 1G, a third polysilicon film 42, being a material film for forming a control gate, and a tungsten silicide (Wsix) film 44 are sequentially deposited.

In detail, it is preferred that the third polysilicon film 42 is deposited to have a dual structure of a doped film and an undoped film using an amorphous silicon film by means of a CVD, PE-CVD, LP-CVD or AP-CVD method at a temperature of 510~550° C. under a pressure of 1.0~3 torr, so that it is substitutionally solidified into the dielectric film 40 when the tungsten silicide film 44 is deposited in order to prevent diffusion of fluoric acid that may increase the thickness of the oxide film and prevent creation of a WPx layer formed through combination of tungsten (W) and phosphorous (P). Thereby, it is possible to prevent a phenomenon that a subsequent tungsten silicide film 44 is blown up. The ratio of the doped film and the undoped film is set to 1:2~6:1 and the amorphous silicon film of about 500~1500 Å in thickness is formed so that the gap between the second polysilicon films 26 is sufficiently buried. Accordingly, a gap is not formed when a subsequent tungsten silicide film 44 is deposited and a word line resistance (Rs) could be thus reduced. When the third polysilicon film 42 of the dual structure is formed, it is preferred that the doped film is formed using $SiH_4$ or $Si_2H_6$ and $PH_3$ gas, and $PH_3$ gas is stopped and the undoped film is consecutively formed.

It is preferred that the tungsten silicide film 44 is grown in stoichiometry of 2.0~2.8 in which an adequate step coverage is implemented and the word line resistance (Rs) is minimized at a temperature of 300~500° C., using reaction of $MS(SiH_4)$ or $DCS(SiH_2CL_2)$ and $WF_6$ containing a low fluorine and having a low post annealed stress and a good adhesive force, An ARC layer (not shown) is deposited on the tungsten silicide film 44 using $SiO_xN_y$ or $Si_3N_4$. A gate mask and etching process and a self-aligned mask and etching process are implemented to form a flash memory cell.

As described above, after the floating gate is formed, a nitrification process is implemented to form a nitrification layer on the floating gate electrode. Therefore, the disclosed methods can improve the characteristic of the dielectric film, characteristics of a leakage current, a breakdown field and charge-to-breakdown, and the roughness of the surface of the floating gate electrode.

Also, the disclosed methods can simplify the manufacturing process since the nitrification process and the dielectric film formation process are implemented in-situ.

Furthermore, existing equipment can be employed with the disclosed methods without requiring new equipment. Therefore, the disclosed methods can fabricate devices of a high reliability at low cost.

The forgoing embodiments are merely exemplary and are not to be construed as limiting of this disclosure. The present teachings can be readily applied to other types of apparatuses. The description of the disclosed methods is intended to be illustrative, and not to limit the scope of the claims. Many alternatives, modifications, and variations will be apparent to those skilled in the art.

What is claimed is:

1. A method of manufacturing a semiconductor device, comprising the steps of:
    (a) providing a semiconductor substrate in which a floating gate electrode is formed;
    (b) forming a tunnel oxide film on the semiconductor substrate;
    (c) sequentially forming a first polysilicon film and a pad nitride film on the tunnel oxide film;
    (d) etching the pad nitride film, the first polysilicon film, the tunnel oxide film and the semiconductor substrate with a patterning process to form a trench in the semiconductor substrate;
    (e) depositing an oxide film on the entire structure including the trench and then planarizing the oxide film with the pad nitride film until the pad nitride film is exposed;
    (f) removing the pad nitride film and then depositing a second polysilicon film on the entire structure;
    (g) patterning the second polysilicon film to form the floating gate electrode;
    (h) nitrifying a top surface of the floating gate electrode;
    (i) forming a dielectric film on the entire structure including the floating gate; and
    (j) forming a material film for a control gate electrode on the dielectric film,
    wherein the step of nitrifying the top of the floating gate electrode and the step of forming the dielectric film are performed in-situ within the same chamber.

2. The method as claimed in claim 1, wherein the dielectric film has an ONO structure on which a first oxide film, a nitride film and a second oxide film are sequentially stacked.

3. The method as claimed in claim 1, wherein the steps (h) and (i) that are in-situ implemented within the same chamber comprises:
    (h) (1) introducing $N_2O$ gas of 100~10000 sccm at a temperature of 800~950° C. to nitrify the top of the floating gate electrode;
    (i) (1) introducing $N_2O$ gas and DCS ($SiH_2Cl_2$) gas under a pressure of 0.1~3 torr at a temperature of 790~830° C. to form a first oxide film on the entire structure;

(i) (2) introducing DCS ($SiH_2Cl_2$) gas and $NH_3$ gas under a pressure of 0.1~3 torr at a temperature of 650~800° C. to form a nitride film on the first oxide film; and (i) (3) introducing $N_2O$ gas and DCS ($SiH_2Cl_2$) gas under a pressure of 0.1~3 torr at a temperature of 790~830° C. to form a second oxide film on the nitride film.

4. The method as claimed in claim 3, wherein the ratio of DCS ($SiH_2Cl_2$) gas and $N_2O$ gas is 1:5~1:10.

5. The method as claimed in claim 1, further comprising, between steps (b) and (c), the step of implementing an annealing process using $N_2$ at a temperature of 900~910° C. for 20~30 minutes.

6. The method as claimed in claim 1, further comprising, between the steps (h) and (i), a step of implementing a steam anneal process of a wet oxidization mode at a temperature of 750~800° C. so that the thickness of the dielectric film is in the range of 150~300 Å.

7. The method as claimed in claim 1, wherein the steps (h) and (i) that are performed in-situ and within the same chamber and comprise:

(h1) loading a semiconductor substrate in which a floating gate electrode is formed into a deposition chamber;

(h2) changing the temperature within the deposition chamber to a first deposition temperature;

(h3) nitrifying the top surface of the floating gate electrode at the first deposition temperature;

(i1) changing the temperature within the deposition chamber to a second deposition temperature range;

(i2) forming a dielectric film on the entire structure at the second deposition temperature range; and (i3) unloading the semiconductor substrate from the deposition chamber.

8. The method as claimed in claim 7, wherein the first deposition temperature is 800~950° C. and the second deposition temperature range is 650~830° C.

9. The method as claimed in claim 7, wherein the step (h3) comprises introducing $N_2O$ gas into the deposition chamber to nitrify the top surface of the floating gate electrode.

10. The method as claimed in claim 7, wherein the step (i2) comprises the steps of:

introducing $N_2O$ gas and DCS ($SiH_2Cl_2$) gas into the deposition chamber to form a first oxide film;

introducing $NH_3$ gas and DCS ($SiH_2Cl_2$) gas into the deposition chamber to form a nitride film on the first oxide film; and introducing $N_2O$ gas and DCS ($SiH_2Cl_2$) gas into the deposition chamber to form a second oxide film on the nitride film.

11. The method as claimed in claim 10, wherein the ratio of DCS ($SiH_2Cl_2$) gas and $N_2O$ gas is in the range of 1:5~1:10.

12. A method of manufacturing a semiconductor device, comprising the steps of:

(a) forming a tunnel oxide film on the semiconductor substrate;

(b) implementing an annealing process so that a defect density at an interface between the tunnel oxide film and the semiconductor device is minimized;

(c) forming a floating gate electrode on the tunnel oxide film;

(d) nitrifying a top surface of the floating gate electrode;

(e) forming a dielectric film on the entire structure including the floating gate electrode; and (f) forming a material film for a control gate electrode on the dielectric film, wherein the nitrifying of the top surface of the floating gate electrode and the forming of the dielectric film are performed in-situ and within the same chamber.

13. The method as claimed in claim 12, wherein the annealing process is performed in a $N_2$ atmosphere at a temperature of 900~910° C. for 20~30 minutes.

14. The method as claimed in claim 12, wherein the dielectric film has an ONO structure on which a first oxide film, a nitride film and a second oxide film are sequentially stacked.

15. The method as claimed in claim 12, wherein the steps (d) and (e) that are performed in-situ within the same chamber and comprises:

introducing a $N_2O$ gas flow of 100~10000 sccm at a temperature of 800~950° C. to nitrify the top of the floating gate electrode;

introducing $N_2O$ gas and DCS ($SiH_2Cl_2$) gas at a pressure of 0.1~3 torr and at a temperature of 790~830° C. to form a first oxide film on the entire structure including the floating gate;

introducing DCS gas and $NH_3$ gas at a pressure of 0.1~3 torr and at a temperature of 650~800° C. to form a nitride film on the first oxide film; and introducing $N_2O$ gas and DCS ($SiH_2Cl_2$) gas at a pressure of 0.1~3 torr and at a temperature of 790~830° C. to form a second oxide film on the nitride film.

16. The method as claimed in claim 15, wherein the ratio of DCS ($SiH_2Cl_2$) gas and $N_2O$ gas is in the range of 1:5~1:10.

* * * * *